United States Patent
Porter et al.

(10) Patent No.: US 9,859,858 B2
(45) Date of Patent: Jan. 2, 2018

(54) CORRECTION OF UNKNOWN AUDIO CONTENT

(71) Applicant: Apple Inc., Cupertino, CA (US)

(72) Inventors: Simon K. Porter, San Jose, CA (US); Afrooz Family, Emerald Hills, CA (US); Martin E. Johnson, Los Gatos, CA (US); Richard M. Powell, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 162 days.

(21) Appl. No.: 15/000,847

(22) Filed: Jan. 19, 2016

(65) Prior Publication Data

US 2017/0207762 A1    Jul. 20, 2017

(51) Int. Cl.

| | |
|---|---|
| G06F 17/00 | (2006.01) |
| H03G 5/16 | (2006.01) |
| H03G 3/00 | (2006.01) |
| H04R 3/00 | (2006.01) |
| G10L 25/48 | (2013.01) |
| H04R 3/04 | (2006.01) |
| H03G 9/00 | (2006.01) |
| G06F 3/16 | (2006.01) |

(52) U.S. Cl.
CPC .............. *H03G 5/16* (2013.01); *G10L 25/48* (2013.01); *H03G 3/002* (2013.01); *H04R 3/007* (2013.01); *G06F 3/165* (2013.01); *H03G 9/005* (2013.01); *H04R 3/04* (2013.01)

(58) Field of Classification Search
CPC ... H04R 3/04; H03G 3/20; H03G 5/18; H03G 9/005; H03G 9/025; G06F 3/165
See application file for complete search history.

(56) References Cited

U.S. PATENT DOCUMENTS 5,361,381 A    11/1994   Short
9,106,192 B2   8/2015    Sheen et al.
(Continued)

FOREIGN PATENT DOCUMENTS

WO    WO-2014160542    10/2014

OTHER PUBLICATIONS

Fraunhofer, "HE-AAC Metadata for Digital Broadcasting", *Institute for Integrated Circuits*, IIS, White Paper, 2013, 16.

*Primary Examiner* — Thomas Maung
(74) *Attorney, Agent, or Firm* — Blakely Sokoloff Taylor & Zafmann LLP

(57) ABSTRACT

An unknown content audio signal that is input to an audio power amplifier and speaker that have a known gain and speaker sensitivity, is buffered. A portion of the buffered signal is provided to an automatic content recognition (ACR) system, and then a content identifier, of the unknown content signal, as provided by the ACR system is received. Previously determined metadata is also received, for a reference audio content signal that has been assigned to the content identifier. The metadata includes a previously determined reference measure of an audio signal characteristic for the reference content. An input measure of the audio signal characteristic is computed, for the unknown content, and compared with the reference measure. On that basis, and also based on the known gain and speaker sensitivity, at least one of a scalar gain and spectral shaping filtering that is being applied to the unknown content is adjusted. Other embodiments are also described and claimed.

20 Claims, 3 Drawing Sheets

(56) References Cited

U.S. PATENT DOCUMENTS

| | | | |
|---|---|---|---|
| 9,678,707 B2* | 6/2017 | Clayton | G06F 3/165 |
| 2012/0063614 A1* | 3/2012 | Crockett | G11B 20/10527 |
| | | | 381/98 |
| 2014/0037108 A1* | 2/2014 | Christoph | H03G 3/20 |
| | | | 381/107 |
| 2014/0142958 A1 | 5/2014 | Sharma et al. | |
| 2014/0193001 A1* | 7/2014 | Oishi | G06Q 30/0631 |
| | | | 381/101 |
| 2014/0321670 A1 | 10/2014 | Nystrom et al. | |
| 2015/0156588 A1* | 6/2015 | Kyriakakis | H04R 3/04 |
| | | | 381/98 |

* cited by examiner

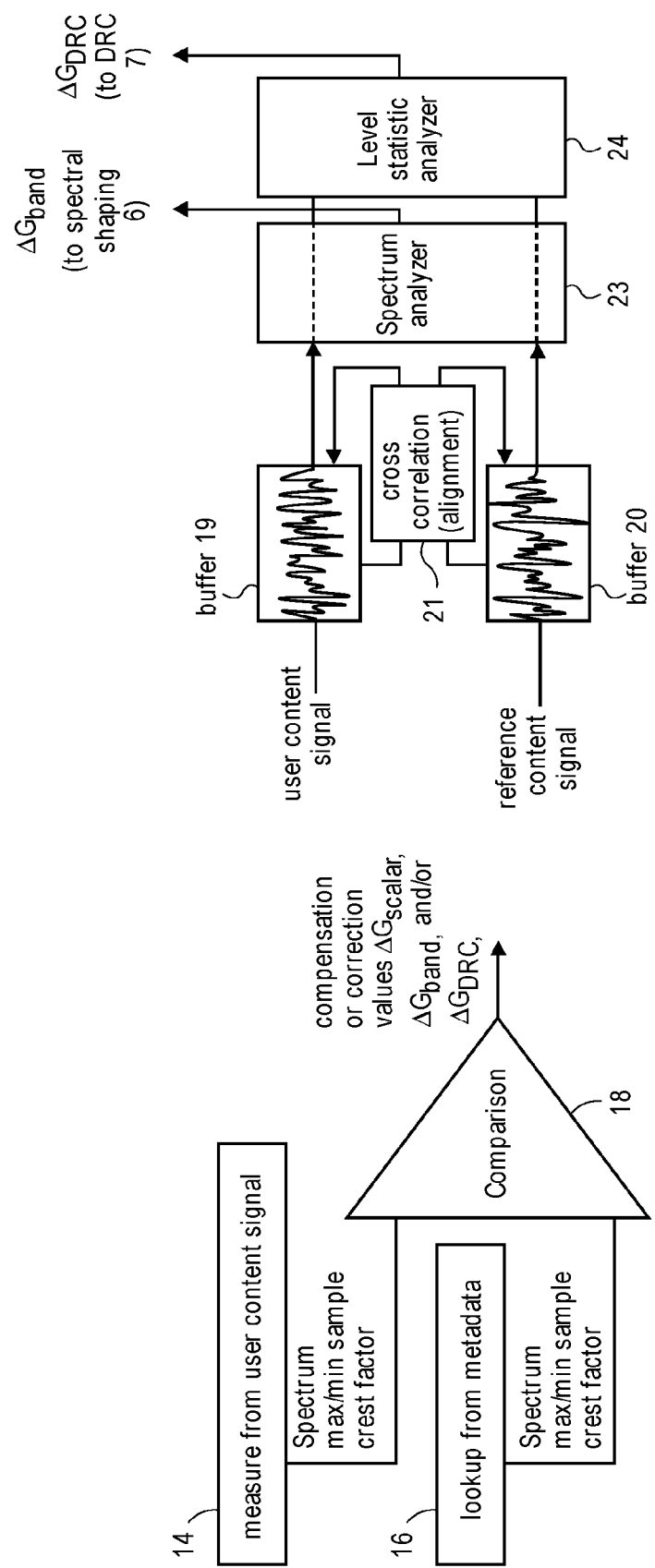

CORRECTION OF UNKNOWN AUDIO CONTENT

BACKGROUND

Human beings hear and perceive high pitch and low pitch sounds unevenly. For example, when listening to a 200 Hz tone and a 1000 Hz tone that are produced at the same sound pressure level (SPL), the latter is perceived to be much louder. This is also referred to as perceiving audio loudness with a non-linear, frequency-dependent relationship, relative to measured SPL. A technique referred to as loudness compensation aims to correct for such non-linear, frequency dependent perception of sound, by equalizing or balancing the spectral content of an audio signal. The compensation is typically applied to an audio signal during playback, in response to for example an on/off switch that a user can manually turn on, to change the levels of the high and low frequencies relative to the mid frequencies, so that for example at high SPLs the highs and lows are turned down. Loudness compensation may also be automatic, based on detecting the current user volume setting and in response boosting the low frequencies at low volume settings or attenuating them at high volume settings. Another frequently encountered issue during audio playback is that the user may need to manually adjust an equalizer or the volume setting, each time a different type of song is being played, or a different audio programming channel has been selected.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

An embodiment of the invention is a more intelligent approach to correct, or compensate, a user-supplied audio signal upon which unknown audio signal manipulation may have been performed. This is intended to improve the sound quality heard by the user, for example by loudness compensation. The correction process aims to avoid overcompensating in situations where an unknown content digital audio signal is to be input to an audio power amplifier and speaker system (playback system) that have a known gain and speaker sensitivity. The unknown content audio signal may have undergone an audio manipulation process that has altered it in an unknown manner, e.g., scaling, equalization, or dynamic range compression. The unknown content audio signal may originate from any one of a variety of different sources, such as any one of a number of different music streaming or music delivery services (over the Internet) that may have decided to manipulate the content differently such as for example by boosting bass or boosting program loudness. The same content coming from different sources will thus sound different, even in the same playback system; also however, there is the possibility of overcompensating an aspect of the content, if the source had already manipulated that aspect of the audio signal.

The correction process may begin with providing a portion of an unknown content digital audio signal (also referred to here as a user content audio signal) to an automatic content recognition (ACR) system. It then receives a content identifier, for the portion of the unknown content signal, as provided by the ACR system. With the content identifier now known, the process proceeds with obtaining previously determined metadata for a reference audio content signal that has been assigned to the content identifier. The metadata includes a previously determined reference measure of an audio signal characteristic for the reference audio content signal. Examples of such audio signal characteristics include a musical property being beats per minute or duration and key, a playback rendition parameter being relative volume adjustment (scaling factor or recording level), crest factor, level (e.g., rms voltage level, or continuous average power), and perceptual loudness (such as short term or long term loudness values.) The process continues with computing an input measure of the audio signal characteristic, for the unknown content signal, and then compares the input measure with the reference measure. Based on that comparison, and optionally also based on a current user setting for playback through the audio power amplifier and speaker system (e.g., user volume), one or more audio signal processing blocks are adjusted. These may include a scalar gain block and a spectral shaping filter, and optionally also a dynamic range control block. The unknown content signal is passed through the audio signal processing blocks and into the audio power amplifier and speaker.

The audio signal processing blocks may have been previously "tuned", for example in a laboratory, to produce a desired sound quality when another audio signal was being played back through the audio power amplifier and speaker, or for example in view of the known gain and sensitivity of the system; the in-the-field adjustments made to these signal processing blocks (by the correction process) are based on having discovered how the user version of certain content is different than a reference version of that content. That discovered difference is used to decide by how much (if any) the existing tuning of one or more of the signal processing blocks should be changed, to avoid overcompensating a particular aspect of the content.

The above summary does not include an exhaustive list of all aspects of the invention. It is contemplated that the invention includes all systems and methods that can be practiced from all suitable combinations of the various aspects summarized above, as well as those disclosed in the Detailed Description below and particularly pointed out in the Claims section. Such combinations may have particular advantages that are not specifically recited in the above summary.

BRIEF DESCRIPTIONS OF DRAWINGS

The embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

FIG. 2 is a block diagram of part of an analysis and comparison logic that uses metadata for the reference content, to produce correction values to adjust the digital audio signal processing blocks.

FIG. 3 is a block diagram of components that may be added to the analysis and comparison logic to perform spectral and level statistics analysis upon the reference content, to produce correction values.

DETAILED DESCRIPTION

Several embodiments are now described with reference to the appended drawings. While numerous details are set forth, it is understood that some embodiments of the invention may be practiced without these details. In other instances, well-known circuits, structures, and techniques have not been shown in detail so as not to obscure the understanding of this description.

Figure 1:
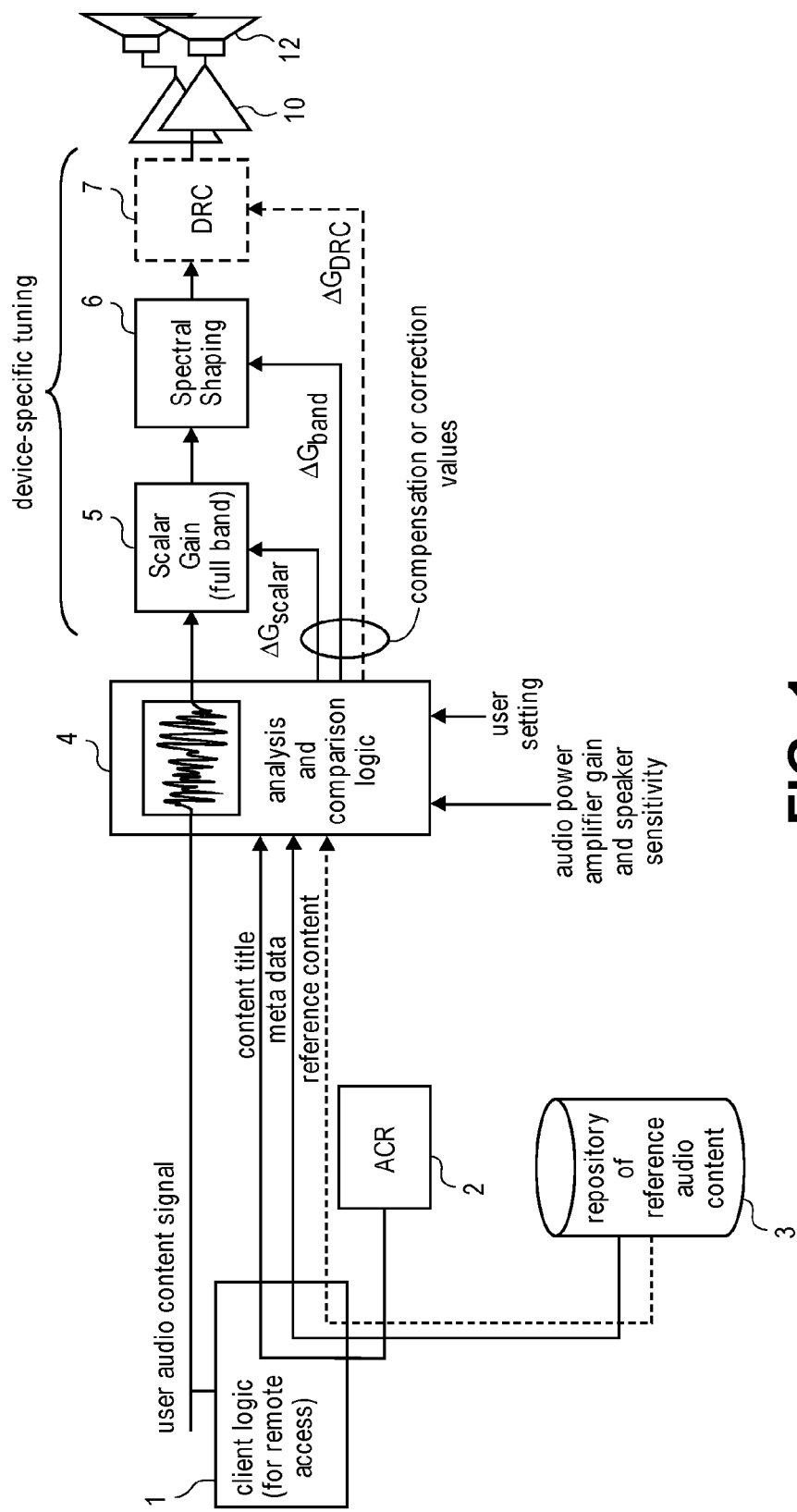
FIG. 1 is a block diagram of an audio signal processing and playback system.

FIG. 1 is a block diagram of an audio signal processing and playback system that performs a correction process. The correction process aims to adjust, but only if needed, one or more digital audio signal processing components that are shown in the figure under the heading, "device-specific tuning." These components may be part of a consumer electronic device, such as a desktop computer, a laptop computer, a smartphone, a tablet computer, or other audio system. The correction process may be running in the same device as the device-specific tuning components. The correction process aims to enhance the sound quality of a user content digital audio signal as heard by a user in-the-field, when an audio power amplifier 10 (e.g., a class D amplifier) and speaker 12 (e.g., an electro-dynamic loudspeaker) are driven with the signal. In one embodiment, the combination of the audio power amplifier 10 and the speaker 12 may be integrated within a housing of the desktop computer, laptop computer, smartphone or tablet computer, together with the device specific tuning components and the components (to be described below) that implement the correction process; in another embodiment, the combination of the audio power amplifier 10 as coupled to drive the speaker 12 may be integrated within a self-powered speaker dock (e.g., for a portable device such as a smartphone), or a self-powered wireless speaker (having a speaker cabinet in which the audio power amplifier 10, the speaker 12, a power supply), along with a wired or wireless digital audio signal communications interface that serves to receive the audio signal from an external device (e.g., external to the speaker dock or speaker cabinet) in which the device-specific tuning components and the correction process components are integrated. In yet another embodiment, the audio power amplifier 10 and the device-specific tuning components may be integrated inside a separate housing than the speaker cabinet, where the latter may contain only the speaker 12; in that case, an output of the audio power amplifier 10 may be connected to directly drive the signal input of the speaker 12 through a passive, wired (or cable) connection. In one embodiment, the system may be within a room or other confined space that also contains one or more microphones that can be used for measuring sound playback level (sound pressure level) of a user content audio signal, during its playback through the amplifier 10 and the speaker 12. The microphones may be integrated within another electronic device, e.g., a smartphone, a wearable computing device, or a headset. Such a device effectively acts as a sound level meter. Other ways of obtaining a measure of the sound playback level may be included. The measure of sound playback level can be used by the correction process as described below, to further inform its adjustment of certain audio signal processing that have an initial, device-specific tuning in them.

The audio content in the user content audio signal may for example be a musical work of art, such as a song, or the sound track of an audio-visual work of art, such as a movie. The audio signal may arrive through any one of a variety of different paths, e.g., headphone (analog) audio input plug, line in (analog) input plug, a digital audio or movie player program that is playing back a locally-stored music or movie file; it may originate from any one of a variety of different online digital music and movie delivery services (using an application program such as a Web browser or a mobile app through which the audio content signal is streamed or downloaded into local memory from a server of the delivery service over the Internet.) Depending upon the source, the producer or distributer of the audio content may have decided to manipulate the content differently. For example, certain online streaming services will apply a scalar gain (scaling factor) and also upward compress the signal (reducing dynamic range), so as to increase the perceptual loudness; others perform a bass boost to make the low frequency sounds louder.

The user content audio signal may be in any suitable digital audio format, e.g., pulse code modulated. It may contain a single audio channel (e.g. the left stereo channel or the right stereo channel.) The adjustments by the correction process may however be applied to two or more audio channels, if the power amplifier 10 and speaker 12 for each of the channels are similar in gain and sensitivity, noting that both the gain and the sensitivity may be frequency dependent. A separate correction process may be provided, to adjust the audio signal that is input to each audio channel that has distinct power amplifier gain and speaker sensitivity, e.g. a sub-woofer.

The system includes two or more audio signal processing blocks, such as a scalar gain block 5 for applying scalar (full band) gain (e.g., multiplying by a scalar gain value, yielding a full band effect) to the user content audio signal, and a spectral shaping block 6 (shaping filter) for shaping one or more distinct frequency bands of the user content audio signal (e.g., a combination of one or more bandpass filters, or shelf filters). These blocks may be linear time invariant systems, and as such may be applied to the user content audio signal in any order. An option is to also include a dynamic range control, DRC, block 7 for controlling a dynamic range of the user content audio signal in accordance with a DRC setting such as a compression ratio; DRC (e.g., compression) is a nonlinear operation and may be performed at a point downstream of the scalar gain block 5 and the spectral shaping block 6 as shown. These blocks are all variable or configurable, and may have been configured either upon manufacture, or upon power up or system reset, with an initial, device-specific tune, e.g., having parameters such as scalar gain, gain in a given frequency band, input level and compression setting (e.g., compression ratio), that are specific to a particular design or model of the audio power amplifier 10 and speaker 12. These initial parameters may have been selected at the factory, by for example audio engineers, to produce a desired sound quality when a certain audio signal is being played back (through the particular model of the audio power amplifier 10 and speaker 12.) Alternatively, the initial parameters may have been set by an algorithm that takes into account the known gain and sensitivity of the audio power amplifier 10 and speaker 12. As an example, based on having simulated or measured the gain and sensitivity of the audio power amplifier 10 and speaker 12, a loudness compensation algorithm is performed at the factory using a reference audio signal which computes the initial parameters (or initial "tune") of the audio signal processing blocks; the latter are then programmed or configured with these initial parameters, e.g., a certain full band or scalar gain value, and gain values in one or more distinct frequency bands.

The parameters of the audio signal processing blocks may be altered, or in other words adjustments are made to the signal processing blocks (or a different "tune" is applied), by the correction process, during in-the-field use of the audio signal processing and playback system. This may be based on discovering how the user content is different than a reference version of that content. This discovery may be made by the analysis and comparison logic 4. The discovered difference is then used to decide by how much (if any) the existing tuning of one or more of the audio signal processing blocks should be changed, to avoid overcompensating a particular aspect of the content. The user content audio signal is played back through the audio signal processing blocks (and through audio power amplifier 10 and speaker 12) with the different tune applied.

The analysis and comparison logic 4 may be implemented as a programmed digital processor to perform the analysis and comparison operations described below. It also includes memory for buffering the user content audio signal, upstream of the scalar gain block 5, the spectral shaping block 6 (and if used the DRC block 7.) The analysis and comparison operations described below may compute input measures of several audio signal characteristics such as scaling factor, crest factor, true peak, level (e.g., root mean square (rms) level), perceptual loudness, and strength (e.g., magnitude, energy, power) in certain frequency bands, of the buffered user content audio signal. Of course, not all of these audio signal characteristics need to be computed.

In addition, there is client logic 1 which achieves remote access of an audio content recognition (ACR) system 2, and optionally of a repository 3 of reference audio content. The client logic 1 may be implemented as a programmed processor that is part of the audio signal processing and playback device depicted in FIG. 1, that also has a communications transceiver (not shown) which can be used to establish a wired or wireless connection between the system and another device, in order to gain access to the ACR system 2 or to the repository 3. For example, the audio signal processing and playback system may be part of a "local node", of a computer network such as the Internet, while the ACR system 2 and the repository 3 may be in the same "remote node" or in different remote nodes of the network. The client logic 1 can, in that case, use the communications transceiver to, e.g., access an ACR service through a Web server of the ACR system 2 (through a wireless or wired communication link to the Internet enabled by the communications transceiver). The ACR system 2 may implement algorithms that use acoustic fingerprinting, for example, to recognize a portion of an audio signal as being that of a particular musical work or audio visual work (having a known content identifier). The client logic 1 provides a clip (portion) of the buffered user content audio signal to the accessed ACR system 2, and then receives a content identifier, for the clip of the user content audio signal, as provided by the ACR system 2. The algorithm used by the ACR system 2 may be robust enough to recognize the content, despite the clip containing typical audio manipulations (changes) to scaling factor, gain in a particular frequency band, and audio compression (dynamic range control).

Once the content identifier is known, the client logic 1 can be used to also receive previously determined metadata for a reference content audio signal that has been assigned to the content identifier. The metadata includes one or more previously determined reference measures of audio signal characteristics for the reference content audio signal. In one embodiment, the metadata may be received from the repository 3 (as a remote node in the Internet, through the communications transceiver of the audio signal processing and playback system), in response to the client logic 1 having requested the repository 3 to produce metadata for the content identifier. The metadata received from the repository 3 is then forwarded to the analysis and comparison logic 4.

In some embodiments, described below in connection with FIG. 3 and FIG. 4, in addition to providing metadata, the repository 3 may also serve to supply the client logic 1 with the reference content audio signal itself. The client logic 1 in that case also forwards the reference content audio signal to the analysis and comparison logic 4. The latter may use it, for example, to perform direct spectral comparisons and/or direct, perceptual loudness comparisons over time (e.g., short term and long term loudness calculations), between the user content and the reference content audio signals (see FIG. 3).

Turning now to FIG. 2, the analysis and comparison logic 4 may include a measure unit 14 as a means for computing an input measure of an audio signal characteristic, for the user content audio signal; and a lookup unit 16 for looking up the reference measure from the metadata. It also includes a comparison unit 18 as a means for comparing the input measure with the reference measure, and for producing a correction value (or compensation value). The latter is produced based on i) comparing the input measure with the reference measure, and ii) the gain and speaker sensitivity of the audio power amplifier 10 and the speaker 12. A correction value may adjust the scalar gain block 5 or the spectral shaping block 6 (see FIG. 1.) More than one correction value may be computed and applied to update its respective audio signal processing block, based on a given comparison between the input measure and the reference measure. The correction value may be computed as a "delta" (as shown in the example of FIG. 1), which is an adjustment to the initial parameter of its audio signal processing block; this computation may be in accordance with a math relationship that has been defined at the factory, in view of the gain and sensitivity of the audio power amplifier 10 and the speaker 12 (depicted in FIG. 1 as an input to the analysis and comparison logic 4.)

It should be noted that the user content audio signal is an "unknown" to the correction process here, in that it contains audio content whose content identifier is unknown to the process (until received from the ACR system 2), and which has undergone unknown audio manipulations. In addition, the user content audio signal (as buffered by the analysis and comparison logic 4) may contain or reflect the application of user settings for the current playback, such as a scalar gain that is in accordance with a user volume setting for playback (through the connected audio power amplifier 10 and speaker 12).

Also, when, as said above, a correction value is produced based on i) comparing the input measure with the reference measure, and ii) the gain and speaker sensitivity of the audio power amplifier 10 and the speaker 12, this does not mean that the gain and speaker sensitivity are, in all instances, distinct, stored values in memory that need to be recalled and used whenever a correction value is computed. For instance, a threshold amount may have been previously computed (e.g., in the laboratory) based on the known gain and speaker sensitivity; if the input measure is not different than the reference measure by at least this threshold amount, then this may suggest no correction is needed (or the associated correction value is zero).

In another embodiment, a measure of the sound playback level of the user content audio signal, as the latter is being input to the audio amplifier 10 and the speaker 10 for playback, is also provided to the comparison unit 18. This may be obtained using one or more microphones that are in the same playback room or confined space and that can "listen" to the playback, e.g., as part of a separate electronic device such as a smartphone, a headset, a wearable computing device or other electronic device that is communicatively coupled to the comparison unit 18 to provide either a raw microphone audio signal or a sound level computation. The measure of sound playback level can be used by the correction process, informing it for example how loud the room is, which can help further inform the adjustment that it makes to the scalar gain block 5 and the spectral shaping block 6.

The user content audio signal may have been manipulated as per other user settings, such as a user-selected equalization setting. This user setting may be supplied as an input to the comparison unit 18 (see FIG. 2), so that the correction (imparted to the scalar gain block or to the spectral shaping block) may be further based on the user setting. For example, consider that the scalar block 5 has been tuned in the factory to impart 0 dB gain, based on a reference audio signal that had −1 to 1 signal swing at 100% (maximum) user volume, for a the particular combination of gain and sensitivity of the audio power amplifier 10 and speaker 12. If the user content now has a swing of −0.4 to 0.4 (as measured by the analysis and comparison logic 4), with the understanding that it also reflects an 80% volume setting, then a correction value deltaGscalar is computed for the scalar gain block 5 (see FIG. 1) that will compensate for such an unusually low signal swing, by being for example +3 dB. The math relationship that will produce this correction value can be readily derived in a laboratory setting through a combination of trial and error procedures and simulations with different reference audio signals and programmed into the analysis and comparison logic 4.

As another example, assume that the audio power amplifier 10 has a −10V to 10V maximum output swing (as measured or simulated at factory) when driving the speaker 12, where this translates into given gain and sensitivity values. Due to a downscaling factor that has been applied to the user content (upstream of the analysis and comparison logic 4), the measure unit 14 obtains max/min samples from the user content (see FIG. 2) which translate into a computed swing of −7V to +7V at an 80% volume setting; in that case, a correction value deltaGscalar is computed (by the comparison unit 18) that will result in the output swing of the audio power amplifier 10 being raised to +/−10V if the volume setting is at 100%.

In one embodiment, the measure unit 14 computes a measure of crest factor (e.g., peak to rms ratio, or peak to average power ratio) of the user content, taken or computed (for the comparison unit 18) on a buffered portion of the user content audio signal. This is then compared to a reference measure of crest factor, obtained by the lookup unit 16, from the received metadata. A crest factor value may cover a time chunk or digital frame of the audio content. This comparison, performed to produce the correction values, may also be informed by or takes into account the current user volume setting and the gain and sensitivity of the audio power amplifier and speaker. The rules for computing the correction values may be designed to scale and/or frequency-shape the user content appropriately, so that perceptual loudness of the audio content being played back is adjusted properly, by for example shaping not only low frequency content but also mid and high frequency contents simultaneously.

Still referring to FIG. 2, in another embodiment, the previously determined metadata includes a reference measure of program loudness, or loudness per time frame, or recording level, for the reference audio content signal. The correction process in that case performs a lookup (by the lookup unit 16) into the received metadata to obtain the reference measure of loudness or recording level; it also computes an input measure of program loudness or loudness per time frame or level, upon the user content audio signal (by the measure unit 14). The input measure of program loudness or loudness per time frame or level is then compared (by the comparison unit 18) with the reference measure of program loudness or loudness per time frame or level, and on that basis a correction value deltaGscalar or deltaGband is computed that adjusts the scalar gain block 5 or the spectral shaping block 6, respectively (see FIG. 1), so that the perceptual loudness or level during playback of the user content is closer to the reference measure.

In yet another embodiment of the correction process, the previously determined metadata for the reference audio content signal includes reference measures of both crest factor and scaling factor (for the reference audio content signal). In that case, input measures of crest factor and scaling factor are computed (upon the user content signal.) The comparison unit 18 in this case computes an input measure of perceptual loudness or level, using the input measures of crest factor and scaling factor, and the known gain and speaker sensitivity of the audio power amplifier 10 and the speaker 12. It may also compute a reference measure of perceptual loudness or level, using the reference measures of crest factor and scaling factor (and the known gain and speaker sensitivity of the audio power amplifier 10 and the speaker 12), or it may obtain one from the metadata using the lookup unit 16. Based on these perceptual loudness or level measures and their comparison, the comparison unit 18 computes one or more of the following correction values: deltaGscalar; deltaGband; and perhaps deltaGdrc. The latter is an adjustment to the optional DRC block 7 (see FIG. 1) through which the user content audio signal may also be passing. Together, the correction values are designed to bring the perceptual loudness or level of the user content that is currently playing closer to a reference perceptual loudness or a reference level.

Still referring to FIG. 1, as mentioned above, an optional feature is to include as part of the audio signal processing blocks the DRC block 7, which is a means for digitally controlling a dynamic range of the user content audio signal in accordance with a DRC setting, e.g., compression ratio. When the user content audio signal passes through the DRC block 7, its dynamic range may be altered in accordance with a DRC parameter or setting, e.g., a compression ratio, or a gain vs. level curve; this parameter or setting (e.g., gain vs. level curve) is variable; its default or initial setting can be changed in accordance with the correction value deltaGdrc that is computed by the analysis and comparison logic 4, e.g., as in FIG. 2. For example, consider the case where the received metadata includes a reference measure of dynamic range. In that case, the lookup unit 16 obtains the reference measure via lookup while the measure unit 14 is computing an input measure of the dynamic range, for the user content audio signal. The comparison unit 18 is comparing the input and reference measures of dynamic range, and producing a correction value deltaGdrc based on i) comparing the input and reference measures of dynamic range, and ii) knowledge of the gain and speaker sensitivity of the audio power amplifier 10 and speaker 12. The correction value deltaGdrc adjusts the DRC block 7 by for example changing a DRC compression ratio or a gain vs. level curve from its initial setting, as per a correction amount. In another embodiment, the comparison unit 18 may also compute one or more other correction values (based on the same instance of comparison between the input and reference measures of dynamic range), such as deltaGscalar and deltaGband (the latter serving to adjust the scalar gain block 5 and the spectral shaping block 6 (see FIG. 1.) Any combination of the following comparisons can then be made: i) the input measure of dynamic range and the reference measure of dynamic range (by at least a predetermined threshold, e.g., previously determined in a laboratory and stored as part of the comparison unit 18); an input playback level and a reference level; and comparisons between input level in a particular frequency band and its corresponding reference level. The resulting adjustments may include one or more the following, a) adjusting a gain of the scalar gain block 5, b) adjusting gain in a particular frequency band of a transfer function or frequency response of the spectral shaping block 6, or c) adjusting dynamic range compression by the DRC block 7.

Turning now to FIG. 3, this is a block diagram of components that may be added to the analysis and comparison logic 4, to perform spectral and level statistics analysis upon the reference content audio signal, for producing correction values. For both the spectral analysis and level statistics analysis, the correction process in this case receives the reference content audio signal (from a remote server of the repository 3 over the Internet (see FIG. 1), and buffers it (in a buffer 20) while the user content audio signal is also buffered (in a buffer 19.) A cross correlation unit 21 serves to time align the two, buffered audio signals, so that a spectrum analyzer 23 can compute measures of the spectral content in essentially the same window of time, in the two, buffered audio signals, respectively. These may be referred to here as a reference measure and an input measure, respectively. The window of time may for example cover a desired event of interest, such as a particular segment of a song or a particular scene of a movie (in the user content and reference content). The spectrum analyzer 23 compares the input and reference measures of the spectral content that it has computed, and on that basis (as well as based on the known gain and sensitivity of the audio power amplifier and speaker, and any user setting such as volume level) computes a correction value deltaGband, for adjusting the spectral shaping block 6. In one embodiment, this adjustment may be temporary in that once the window of time or the desired event has passed, the spectral shaping block 6 reverts back to its previous tune (e.g., its initial tune.)

Still referring to FIG. 3, the time alignment performed by the cross correlation unit 21 upon the two buffered signals may also be used by a level analyzer 24, to compute measures of level (e.g., rms level, short term perceptual loudness, or perceptual loudness over a number of time frames) of the two buffered audio signals, respectively, for essentially the same window of time. These may also be referred to here as a reference measure and an input measure, respectively. The window of time may for example cover the same desired event of interest in both the user content and reference content, such as a particularly soft or loud segment of a song, or a particular scene of a movie such as a dialog scene or a music only scene. The level analyzer 24 compares the input and reference measures of the level that it has computed, and on that basis (as well as based on the known gain and sensitivity of the audio power amplifier and speaker, and any user setting such as volume level) computes a correction value deltaGdrc, for adjusting the audio signal compression imparted by the DRC block 7. In one embodiment, this adjustment may be temporary in that once the window of time or the desired event has passed, the DRC block 7 reverts back to its previous tune (e.g., its initial tune.) As an example, the analyzer 24 computes rms level of the buffered user content signal, e.g., in 10 ms blocks; if the analyzer 24 then determines that these user content rms level statistics have a smaller standard deviation than the standard deviation in the rms level statistics computed from the reference content, then it can be inferred that the user content signal has been compressed (relative to the reference content) and on that basis the deltaGdrc values can be computed accordingly.

Figure 4:
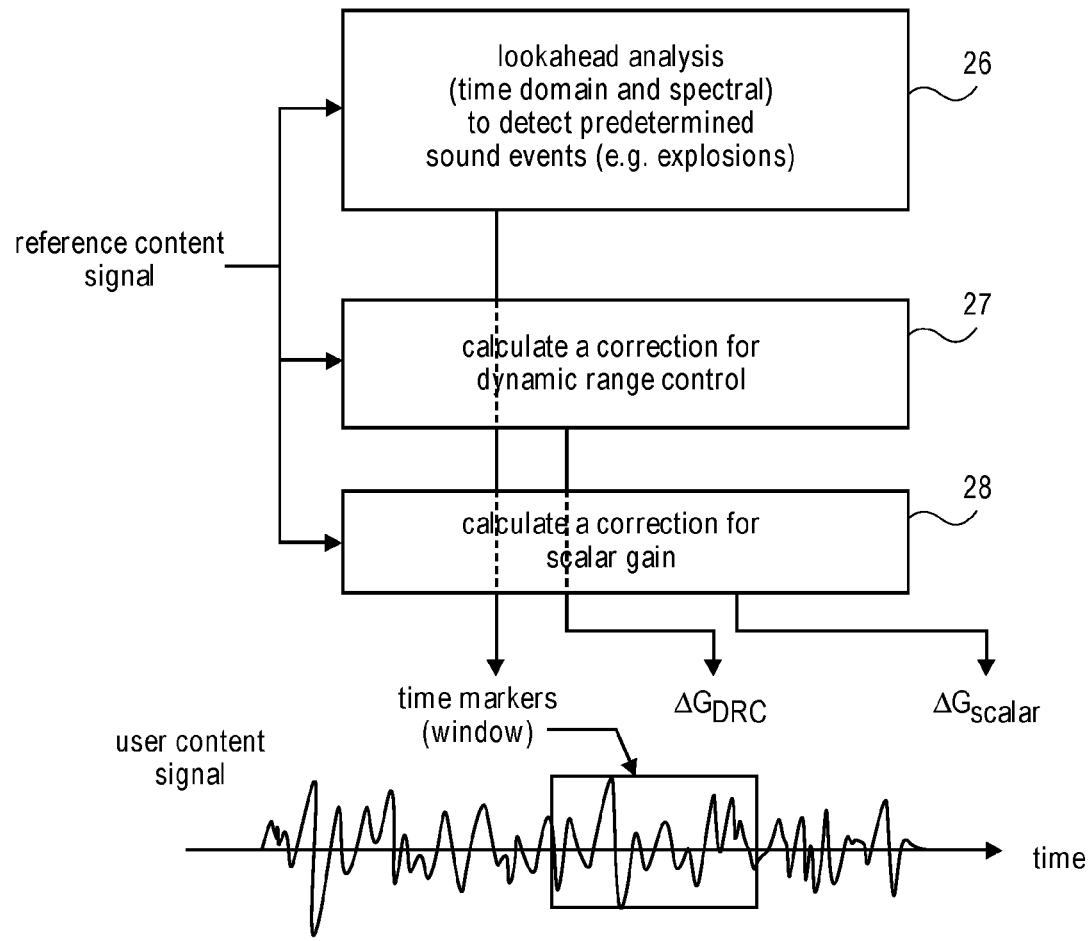
FIG. 4 is a block diagram of components that may be added to the analysis and comparison logic to perform look-ahead analysis upon the reference content, to produce correction values.

Turning now to FIG. 4, this is a flow diagram of operations that may be performed by the analysis and comparison logic 4 (see FIG. 1) in order to produce the correction values, by performing look-ahead analysis upon the reference content and then "waiting" during the playback until the right moment to apply the adjustment to one of the audio signal processing blocks. This embodiment may utilize the time alignment service provided by the buffer 19, buffer 20 and cross correlation unit 21 (see FIG. 3.) Here, a time domain analysis, or a spectral domain analysis, is performed (operation 26), upon the reference content audio signal, to detect a sound event of interest in the reference content, e.g., an explosion in a movie, a sudden and loud interval in a song, or a sub-woofer beat sequence in a song. A correction value deltaGdrc is then calculated (operation 27), and/or a correction value deltaGscalar may be calculated (operation 28), both of which may be based on the detected sound (and based on the known audio power amplifier gain and speaker sensitivity and any user setting such as volume level.) Since the detection in operation 26 provided the identified window of time (e.g., by its starting and ending time markers) during which the sound event of interest occurs in the reference content signal, and since the latter has been time-aligned with the user content signal that is being played back, the correction process in this case can then wait until playback of the user content audio signal reaches the identified starting time marker, before applying one or both of deltaGdrc and deltaGscalar, to adjust the DRC block 7 and/or the scalar gain block 5. In most cases, such an adjustment may be temporary in that once the identified ending time marker has passed, signifying that the event of interest has passed, the affected scalar gain block 5 and/or DRC block 7 reverts back to its previous tune (e.g., its initial tune.)

The above-described correction processes, including the operations performed by the client logic 1 and the analysis and comparison logic 4, may be performed by one or more programmed, digital processors, generally referred to here as "a processor" and memory. The memory has stored therein instructions that when executed by the processor are to perform any of the correction processes described above. For example, the programmed processor can cause a portion of a user content signal, that is to be input to an audio power amplifier that is to drive a signal input of a speaker for playback, to be sent to an ACR system and then receive a content identifier, of the user content signal, as provided by the ACR system. The programmed processor may also receive previously determined metadata for a reference audio content signal that has been assigned to the content identifier. The metadata includes a previously determined reference measure of an audio signal characteristic for the reference audio content signal. The programmed processor computes an input measure of the audio signal characteristic, for the user content signal, and compares the input measure with the reference measure. It then adjusts one of a scalar gain block, a spectral shaping block, or a dynamic range control block through which the user content signal is passing during the playback through the audio power amplifier and speaker. This adjustment may be based on i) the processor having compared the input measure with the reference measure, ii) a user setting for said playback (e.g., a volume level) whose effects are reflected in the user content audio signal that is input to the processor, and iii) the known gain and speaker sensitivity of the audio power amplifier and speaker. An embodiment of the invention may thus be an article of manufacture in which a machine-readable medium (such as microelectronic memory) has stored therein instructions that can program one or more data processing components (generically referred to here as "a processor") to perform the operations described above. In other embodiments, some of these operations might be performed by specific hardware components that contain hardwired logic (e.g., dedicated digital filter blocks and state machines). Those operations might alternatively be performed by any combination of programmed data processing components and fixed hardwired circuit components.

While certain embodiments have been described above and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for correcting unknown audio content to suit an audio power amplifier and speaker, comprising:
    buffering an unknown content audio signal that is to be input to an audio power amplifier and speaker, and wherein the audio power amplifier and speaker have a known gain and speaker sensitivity;
    providing a portion of the buffered, unknown content audio signal to an automatic content recognition (ACR) system, and then receiving a content identifier, for the portion of the unknown content audio signal, as provided by the ACR system;
    receiving previously determined metadata for a reference audio content signal that has been assigned to the content identifier, wherein the metadata includes a previously determined reference measure of an audio signal characteristic for the reference audio content signal;
    computing an input measure of the audio signal characteristic, for the unknown content audio signal;
    comparing the input measure with the reference measure;
    based on i) comparing the input measure with the reference measure, ii) the known gain and speaker sensitivity, and iii) a user volume setting, adjusting at least one of a scalar gain and spectral shaping filtering; and
    applying the scalar gain and the spectral shaping filtering to the unknown content audio signal during playback through the audio power amplifier and speaker.

2. The method of claim 1 wherein the unknown content audio signal reflects the application of a scalar gain that is in accordance with the user volume setting.

3. The method of claim 1 wherein the audio signal characteristic is scaling factor, and wherein said adjusting at least one of a scalar gain and spectral shaping filtering comprises adjusting the scalar gain and not the spectral shaping filtering.

4. The method of claim 1 wherein the previously determined metadata includes a reference loudness measure of program loudness or loudness per time frame or recording level, for the reference audio content signal, the method further comprising:
    computing an input loudness measure of program loudness or loudness per time frame or level, for the unknown content audio signal;
    comparing the input loudness measure with the reference loudness measure;
    based on comparing the input loudness measure with the reference loudness measure, adjusting at least one of the scalar gain and the spectral shaping filtering.

5. The method of claim 1 wherein the previously determined metadata for the reference audio content signal includes reference measures of crest factor and scaling factor for the reference audio content signal, the method further comprising:
    computing input measures of crest factor and scaling factor for the unknown content signal;
    calculating an input measure of perceptual loudness or level using i) the input measures of crest factor and scaling factor, and ii) the known gain and speaker sensitivity of the audio power amplifier and speaker;
    one of a) calculating a reference measure of perceptual loudness or level, using i) the reference measures of crest factor and scaling factor, and ii) the known gain and speaker sensitivity of the audio power amplifier and speaker, or b) obtaining the reference measure of perceptual loudness or level via lookup in the metadata;
    based on the perceptual loudness or level calculations, adjusting at least one of the scalar gain, the spectral shaping filtering, and dynamic range control (DRC) setting; and
    applying the scalar gain and the spectral shaping filtering to the unknown audio content signal, and altering dynamic range of the unknown content audio signal in accordance with the DRC setting.

6. The method of claim 1 further comprising
    receiving the reference audio content signal;
    computing a reference measure of a spectral content in the reference audio content signal;
    computing an input measure of the spectral content in the unknown content signal;
    comparing the reference measure of the spectral content with the input measure of the spectral content; and
    based on comparing the reference and input measures of the spectral content, adjusting the spectral shaping filtering.

7. The method of claim 1 further comprising
    receiving the reference audio content signal;
    computing a reference measure of a perceptual loudness or an rms level from the reference audio content signal;
    computing an input measure of the perceptual loudness or the rms level from the unknown content signal;
    comparing the reference measure of the perceptual loudness or the rms level with the input measure of the perceptual loudness or the rms level; and based on comparing the reference and input measures of the perceptual loudness or the rms level, adjusting a dynamic range control (DRC) setting that is applied to alter dynamic range of the unknown content audio signal.

8. The method of claim 1 further comprising
measuring sound playback level of the unknown content audio signal, as it is being input to the audio power amplifier and speaker,
wherein adjusting at least one of scalar gain and spectral shaping filtering is further based on the measured sound playback level.

9. An audio signal processing and playback system comprising:
means for applying scalar gain to a user content audio signal;
means for shaping a frequency band of the user content audio signal;
an audio power amplifier and speaker to receive the user content audio signal, downstream of the means for applying scalar gain and the means for shaping the frequency band, for playback;
means for buffering the user content audio signal, upstream of the means for applying scalar gain and the means for shaping the frequency band;
means for providing a portion of the buffered user content audio signal to an ACR system, receiving a content identifier, for said portion of the user content audio signal, as provided by the ACR system, and receiving previously determined metadata for a reference content audio signal that has been assigned to the content identifier, wherein the metadata includes a previously determined reference measure of an audio signal characteristic for the reference content audio signal;
means for computing an input measure of the audio signal characteristic, for the user content audio signal;
means for comparing the input measure with the reference measure; and
means for producing a correction value based on i) comparing the input measure with the reference measure, ii) gain and speaker sensitivity of the audio power amplifier and speaker, and iii) a user volume setting, wherein the correction value adjusts at least one of said means for applying scalar gain and means for shaping a frequency band during playback through the audio power amplifier and speaker.

10. The system of claim 9 wherein the received metadata includes a reference measure of program loudness or loudness per time frame or level, the system further comprising:
means for controlling a dynamic range of the user content audio signal;
means for computing an input measure of program loudness or loudness per time frame or level, for the user content audio signal;
means for comparing the input and reference measures, of program loudness or loudness per time frame or level; and
means for producing a correction value based on i) comparing the input and reference measures, of program loudness or loudness per time frame or level, and ii) gain and speaker sensitivity of the audio power amplifier and speaker, wherein the correction value adjusts at least one of said means for applying scalar gain and means for shaping a frequency band and means for controlling dynamic range.

11. The system of claim 9 wherein the audio signal characteristic is crest factor.

12. An article of manufacture, comprising:
a machine readable medium having stored therein instructions that when executed by a processor,
provide a portion of a user content signal that is to be input to an audio power amplifier and speaker for playback, to an ACR system and then receive a content identifier, of the user content signal, as provided by the ACR system,
receive previously determined metadata for a reference audio content signal that has been assigned to the content identifier, wherein the metadata includes a previously determined reference measure of an audio signal characteristic for the reference audio content signal,
compute an input measure of the audio signal characteristic, for the user content signal,
compare the input measure with the reference measure, and
adjust at least one of a scalar gain, spectral shaping filtering, and a dynamic range control setting that is to be applied to the user content signal during playback through the audio power amplifier and speaker, wherein the adjustment is based on i) having compared the input measure with the reference measure, ii) a user volume setting for said playback, and iii) gain and speaker sensitivity of the audio power amplifier and speaker.

13. The article of manufacture of claim 12 wherein the machine readable medium has stored therein instructions that when executed by the processor compute the input measure of the audio signal characteristic as being an input measure of program loudness or rms level, and the reference measure of the audio signal characteristic as being a reference measure of program loudness or rms level,
and wherein when the input measure of program loudness or rms level is larger than the reference measure of program loudness or rms level by at least a threshold, the adjusting of the at least one of the scalar gain, spectral shaping filtering, and the dynamic range control setting comprises one of a) reducing the scalar gain, b) reducing gain in a particular frequency band during the spectral shaping filtering, or c) increasing a dynamic range compression ratio.

14. The article of manufacture of claim 12 wherein the audio signal characteristic is crest factor.

15. An audio signal processing system comprising:
a processor; and
memory having stored therein instructions that when executed by the processor
cause a portion of a user content signal, that is to be input to an audio power amplifier that is to drive a signal input of a speaker for playback, to be sent to an ACR system and then receive a content identifier, of the user content signal, as provided by the ACR system,
receive previously determined metadata for a reference audio content signal that has been assigned to the content identifier, wherein the metadata includes a previously determined reference measure of an audio signal characteristic for the reference audio content signal,
compute an input measure of the audio signal characteristic, for the user content signal,
compare the input measure with the reference measure, and
adjust at least one of a scalar gain, spectral shaping filtering, and a dynamic range control setting that is being applied to the user content signal during the playback through the audio power amplifier and speaker, wherein the adjustment is based on i) having compared the input measure with the reference measure, ii) a user volume setting for said playback, and iii) gain and speaker sensitivity of the audio power amplifier and speaker.

16. The system of claim 15 wherein the audio signal characteristic is program loudness or loudness per time frame or level.

17. The system of claim 15 wherein the previously determined metadata for the reference audio content signal includes reference measures of crest factor and scaling factor for the reference audio content signal, and wherein the memory has stored therein further instructions that when executed by the processor
- compute input measures of crest factor and scaling factor for the user content audio signal,
- calculate an input measure of perceptual loudness or level for the user content audio signal, using i) the input measures of crest factor and scaling factor, and ii) the known gain and speaker sensitivity of the audio power amplifier and speaker,
- obtain a reference measure of perceptual loudness or level, and
- based on the input and reference measures of perceptual loudness or level, adjust at least one of the scalar gain, the spectral shaping filtering, and the dynamic range control setting.

18. The system of claim 17 wherein the memory has instructions that when executed by the processor calculate the reference measure of perceptual loudness or level using i) the reference measures of crest factor and scaling factor, and ii) the known gain and speaker sensitivity of the audio power amplifier and speaker.

19. The system of claim 17 wherein the memory has instructions that when executed by the processor obtain the reference measure of perceptual loudness or level via lookup in the metadata.

20. The system of claim 15 wherein the memory has stored therein further instructions that when executed by the processor
- access the reference audio content signal that is received through a communications transceiver from another remote node of the Internet and compute a reference measure of a spectral content in the reference audio content signal,
- compute an input measure of the spectral content in the user content signal,
- compare the reference measure of the spectral content with the input measure of the spectral content, and
- adjust the spectral shaping filtering based on a) having compared the reference measure with the input measure of the spectral content, b) user volume setting for playback through the audio power amplifier and speaker, and c) gain and speaker sensitivity of the audio power amplifier and speaker.

* * * * *